United States Patent
Andreev et al.

(10) Patent No.: US 6,536,016 B1
(45) Date of Patent: Mar. 18, 2003

(54) METHOD AND APPARATUS FOR LOCATING CONSTANTS IN COMBINATIONAL CIRCUITS

(75) Inventors: Alexander Andreev, San Jose, CA (US); Ranko Scepanovic, San Jose, CA (US); Anatoli Bolotov, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 249 days.

(21) Appl. No.: 09/626,037

(22) Filed: Jul. 27, 2000

(51) Int. Cl.$^7$ .............................................. G06F 17/50
(52) U.S. Cl. .............................. 716/3; 76/2; 76/1; 76/4
(58) Field of Search .................................. 716/1–4, 7

(56) References Cited

U.S. PATENT DOCUMENTS

| | | | | |
|---|---|---|---|---|
| 5,067,091 A | * | 11/1991 | Nakazawa ................... 714/726 |
| 5,349,659 A | * | 9/1994 | Do et al. ........................ 707/7 |
| 5,524,082 A | * | 6/1996 | Horstmann et al. ............ 716/2 |
| 5,754,454 A | * | 5/1998 | Pixley et al. ................ 702/123 |
| 5,774,369 A | * | 6/1998 | Horstmann et al. ............ 716/2 |
| 5,949,691 A | * | 9/1999 | Kurosaka et al. .............. 716/2 |
| 5,974,242 A | * | 10/1999 | Damarla et al. ................ 716/2 |
| 6,212,669 B1 | * | 4/2001 | Jain ............................... 716/7 |
| 6,247,163 B1 | * | 6/2001 | Burch et al. .................... 716/3 |
| 6,308,299 B1 | * | 10/2001 | Burch et al. .................... 716/3 |
| 6,336,206 B1 | * | 1/2002 | Lockyear ...................... 703/15 |
| 6,360,352 B2 | * | 3/2002 | Wallace ........................ 716/11 |
| 2002/0010899 A1 | * | 1/2002 | Wallace ......................... 716/2 |

* cited by examiner

Primary Examiner—Vuthe Siek
Assistant Examiner—Magid Y Dimyan
(74) Attorney, Agent, or Firm—Mitchell, Silberberg & Knupp, LLP (57) ABSTRACT

Constant pins are determined in a combinational circuit by associating an input of a combinational circuit with a first variable and a second variable, with the second variable being the complement of the first variable. For a first logical cell interconnected to such input, a first mathematical representation and a second mathematical representation are computed. The first mathematical representation is a function of the operation of the first logical cell and a function of the first variable, and the second mathematical representation is a function of the operation of the first logical cell and a function of the second variable. A determination is then made as to whether one of the first and second mathematical representations is equal to a constant.

20 Claims, 9 Drawing Sheets

METHOD AND APPARATUS FOR LOCATING CONSTANTS IN COMBINATIONAL CIRCUITS

BACKGROUND OF THE INVENTION

1. Field of the Invention

This invention relates to a method of analyzing and optimizing design of integrated circuit (IC) designs. In particular, the present invention relates to locating constant pins in combinational circuits for the purpose of optimizing such circuits.

2. Description of the Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected, thus connecting the logic circuits having the pins. Because a typical chip has thousands, tens of thousands, or hundreds of thousands of pins, that must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins.

The binary 0 and 1 states are naturally related to true and false logic variables. Accordingly, Boolean algebra is very useful in the design of electronic logic circuits. A useful way of displaying the results of a Boolean operation is with a truth table.

Electronic circuits that combine digital signals according to Boolean algebra are referred to as "logic gates." Commonly used logic circuits are grouped into families. Such families include, for example, resistor-transistor logic (RTL), diode-transistor logic (DTL), transistor-transistor logic (TTL), N-channel metal-oxide silicon (NMOS), complementary metal-oxide silicon (CMOS) and emitter-coupled logic (ECL). Each family has is advantages and disadvantages. ECL is very fast, for example. MOS features very low power consumption and is therefore often used in VLSI technology.

Given the complexity and size of combinational circuits, it behooves one to simplify the designs of such circuits in order to reduce costs and chip size. In combinational circuit designs there may be cell pins that realize a constant function (i.e., either 1 or 0). The present invention involves a new and novel method and apparatus for detecting such constants in combinational circuits and for simplifying the circuits thereby.

SUMMARY OF THE INVENTION

The binary 0 and 1 states are naturally related to true and false logic variables. Accordingly, Boolean algebra is very useful in the design of electronic logic circuits. A useful way of displaying the results of a Boolean operation is with a truth table.

In logic (combinational) circuits, it is desirable to reduce the number of logic gates where possible both from the standpoint of cost and size. The present invention involves a method for determining constant pins in a combinational circuit. The method comprises the steps of associating an input of a combinational circuit with a first variable and a second variable, wherein said second variable is the complement of said first variable, computing for a first logical cell interconnected to said input a first mathematical representation, wherein said first mathematical representation is a function of the operation of said first logical cell and a function of said first value, computing for said first logical cell a second mathematical representation, wherein said second mathematical representation is a function of the operation of said first logical cell and a function of said second value, determining whether one of said first and second mathematical representations is equal to zero. Once constant pins are determined, it is generally possible to simplify the circuit.

DESCRIPTION OF THE PREFERRED EMBODIMENTS

A. Logic Gates and Applicable Boolean Algebra

The binary 0 and 1 states are naturally related to true and false logic variables. Accordingly, Boolean algebra is very useful in the design of electronic logic circuits. A useful way of displaying the results of a Boolean operation is with a truth table.

Figure 1A:
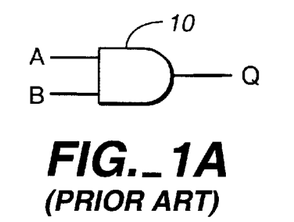
FIG. 1A depicts the schematic symbol for an AND gate.

The schematic symbols of basic logic gates and their associated truth tables are shown in FIGS. 1A to 1E and Tables 1A to 1E, respectively. FIG. 1A depicts the schematic symbol for an AND gate 10. The AND gate 10 has inputs A and B and an output Q. The boolean notation is such that $Q=A \cdot B$. An AND gate operates in accordance with the following truth table (Table 1A). Note that $A \cdot 0=0$; $A \cdot 1=A$; $A \cdot A=A$; and $A \cdot \bar{A}=0$.

TABLE 1A

| A | B | Q |
|---|---|---|
| 0 | 0 | 0 |
| 0 | 1 | 0 |
| 1 | 0 | 0 |
| 1 | 1 | 1 |

Figure 1B:
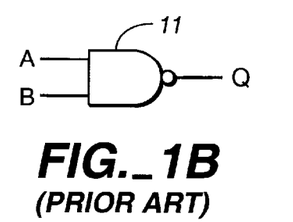
FIG. 1B depicts the schematic symbol for a NAND gate.

FIG. 1B depicts the schematic symbol for a NAND gate 11. The NAND gate 11 has two inputs A and B and an output Q. In accordance with standard Boolean notation, $Q=\overline{A \cdot B}$. A NAND gate operates in accordance with the following truth table (Table 1B).

TABLE 1B

| A | B | Q |
|---|---|---|
| 0 | 0 | 1 |
| 0 | 0 | 1 |
| 1 | 0 | 1 |
| 1 | 1 | 1 |

Figure 1C:
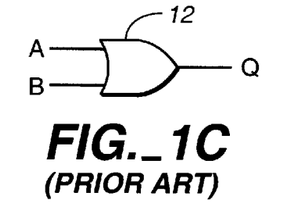
FIG. 1C depicts the schematic symbol for an OR gate.

FIG. 1C depicts the schematic symbol for an OR gate 12. The OR gate 13 has inputs A and B and an output Q. An OR gate operates in accordance with the following truth table (Table 1C). In standard Boolean notation, $Q=A+B$. Note that $A+0=A$; $A+1=$; $A+A=A$; and $A+\overline{A}=1$.

TABLE 1C

| A | B | Q |
|---|---|---|
| 0 | 0 | 0 |
| 0 | 1 | 1 |
| 1 | 0 | 1 |
| 1 | 1 | 1 |

Figure 1D:
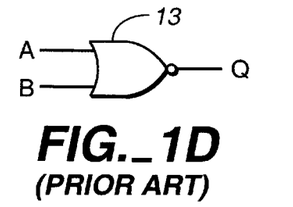
FIG. 1D depicts the schematic symbol for a NOR gate.

FIG. 1D depicts the schematic symbol for a NOR gate 13. The NOR gate 13 has inputs A and B and an output Q. In standard Boolean notation, $Q=\overline{A+B}$. A NOR gate operates in accordance with the following truth table (Table 1D).

TABLE 1D

| A | B | Q |
|---|---|---|
| 0 | 0 | 1 |
| 0 | 1 | 0 |
| 1 | 0 | 0 |
| 1 | 1 | 0 |

Figure 1E:
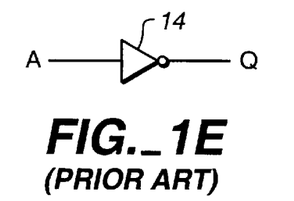
FIG. 1E depicts the schematic symbol for an inverter.

FIG. 1E depicts the schematic symbol for an inverter 14. The NOT gate 14 has an input A and an output Q. In standard Boolean notation, $Q=\overline{A}$. The open circle is used to indicate the NOT or negation function and can be replaced by an inverter in any circuit. A signal is negated if it passes through the circle. The NOT gate operates in accordance with the following truth table (Table 1E).

TABLE 1E

| A | Q |
|---|---|
| 0 | 1 |
| 1 | 0 |

Boolean operations also obey the usual commutative, distributive and associative rules of normal algebra, as shown by the following Table 2.

TABLE 2

| | | |
|---|---|---|
| $\overline{\overline{A}}$ | = | A |
| $A \cdot B$ | = | $B \cdot A$ |
| $A + B$ | = | $B + A$ |
| $A \cdot (B + C)$ | = | $A \cdot B + A \cdot C$ |
| $A \cdot (B \cdot C)$ | = | $(A \cdot B) \cdot C$ |
| $A + (B + C)$ | = | $(A + B) + C$ |
| $A + A \cdot B$ | = | A |
| $A \cdot (A + B)$ | = | A |
| $A \cdot (\overline{A} + B)$ | = | $A \cdot B$ |
| $A + \overline{A} \cdot B$ | = | $A + B$ |
| $\overline{A} + A \cdot B$ | = | $\overline{A} + B$ |
| $\overline{A} + A \cdot \overline{B}$ | = | $\overline{A} + \overline{B}$ |

In addition, use can be made of De Morgan's theorems, as shown below in Table 3.

TABLE 3

| | | |
|---|---|---|
| $\overline{A \cdot B}$ | = | $\overline{A} + \overline{B}$ |
| $\overline{A+B}$ | = | $\overline{A} \cdot \overline{B}$ |

B. Combinational Logic

Figure 2:
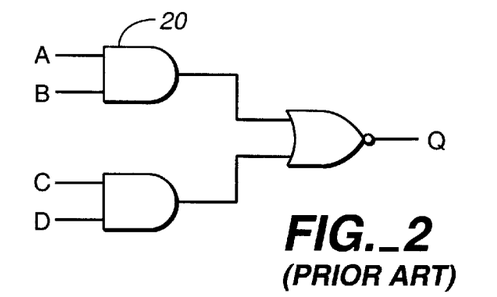
FIG. 2 depicts an AND-OR-INVERT gate.

Useful and complex circuits can be designed using the basic logic gates discussed above as building blocks. An example of a combinational circuit comprising basic gates is an AND-OR-INVERT gate. FIG. 2 depicts such a gate 20. The AND-OR-INVERT gate 20, which has four inputs A, B, C, and D. It operates in accordance with the following Boolean expressions:

$$Q=\overline{A \cdot B + C \cdot D}$$

$$\overline{Q}=A \cdot B + C \cdot D$$

Figure 3A:
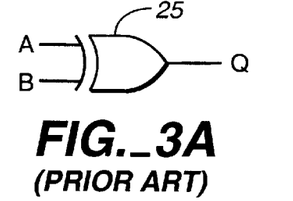
FIG. 3A depicts the schematic symbol for an XOR gate.
Figure 3B:
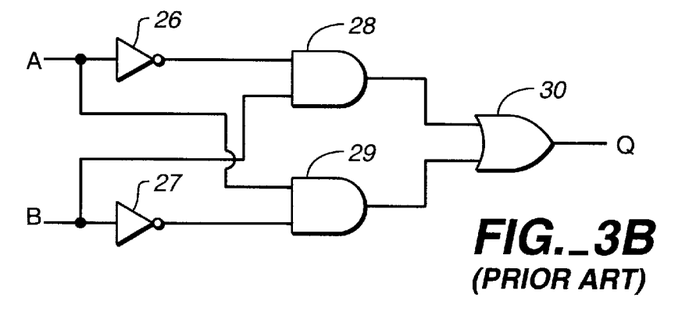
FIG. 3B depicts the mechanization of the XOR gate.

The exclusive-OR gate (EOR or XOR) is a very useful two-input gate. The schematic symbol of the XOR gate 25 is depicted on FIG. 3A and the XOR gate operates in accordance with the truth table below (Table 3A). From the truth table, the mechanization of the exclusive-OR gate can be derived. The mechanization of the XOR gate is depicted in FIG. 3B. The mechanization of the XOR gate is implemented with two NOT gates (26 and 27), two AND gates (28 and 29) and an OR gate (30).

TABLE 3A

| A | B | Q |
|---|---|---|
| 0 | 0 | 0 |
| 1 | 0 | 1 |
| 0 | 1 | 1 |
| 1 | 1 | 1 |

C. Method and Apparatus for Detecting Constants in Combinational Circuits

The present invention involves a new and novel method and apparatus for detecting constants in combinational circuits (i.e., cell pins which realize constant function: 0 or 1).

Figure 4:
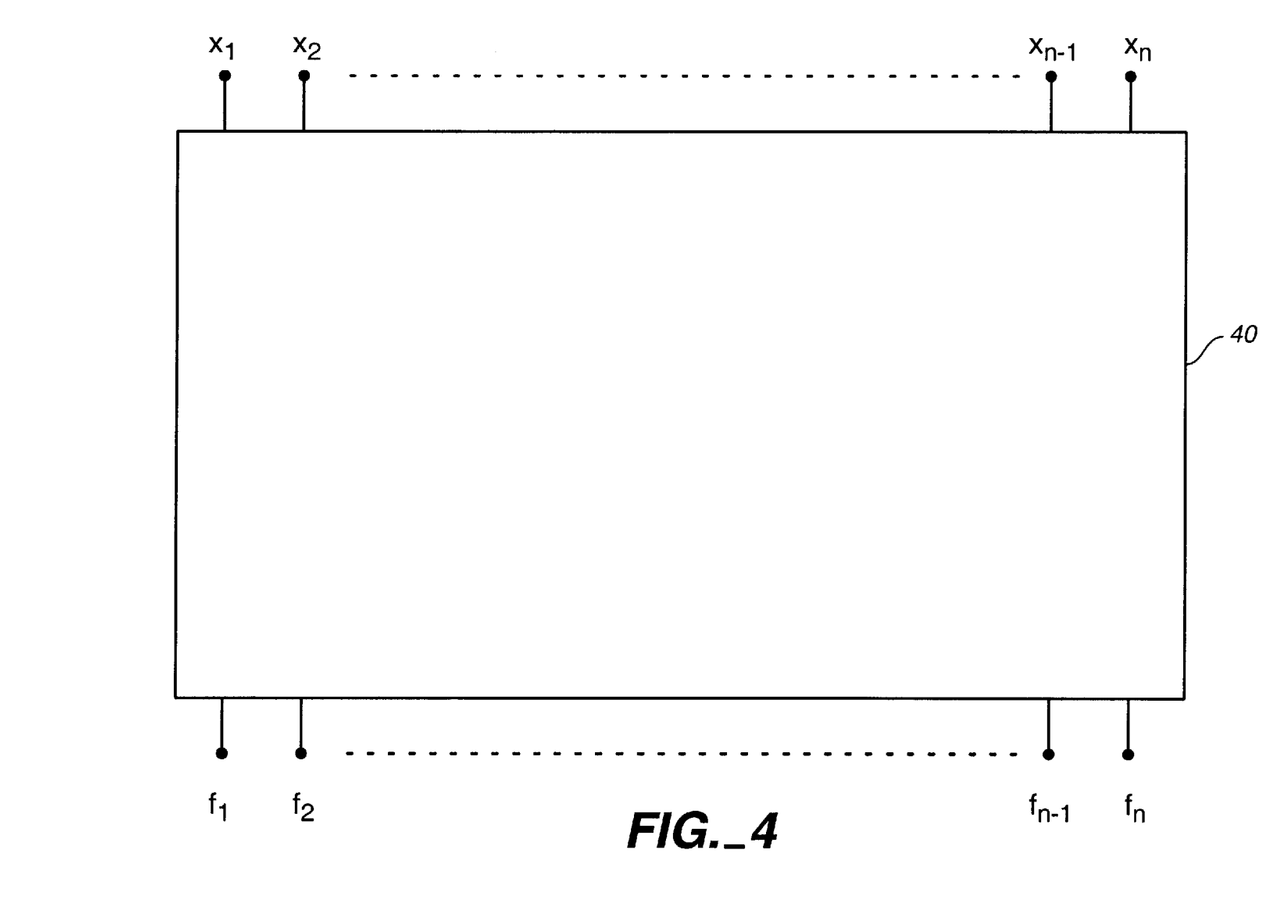
FIG. 4 provides a depiction of a combinational circuit S.

FIG. 4 provides a depiction of a combinational circuit 40. For ease of reference, combinational circuit 40 sometimes is referred to herein as circuit S. The circuit S comprises primary inputs $x_1, x_2, \ldots, x_{n-1}$, and $x_n$. The combinational circuit S also has primary outputs $f_1, f_2, \ldots, f_{k-1}$, and $f_k$. The combinational circuit 40 depicted in FIG. 4 (i.e., circuit S) comprises logic gates and cells, which are not shown in FIG. 4.

In accordance with FIG. 4, let circuit 40 (i.e., S) be a combinational circuit with input variables $x_1, \ldots, x_n$ such that $f_c[p] (x_1, \ldots, x_n)$ is a Boolean function that characterizes the output of pin p of the logical cell c in S. The output pin p is a constant pin if the function $f_c[p] (x_1, \ldots, x_n)$ is equal to constant (i.e., $f_c[p] (x_1, \ldots, x_n)=0$ or $f_c[p] (x_1, \ldots, x_n)=1$).

Figure 5:
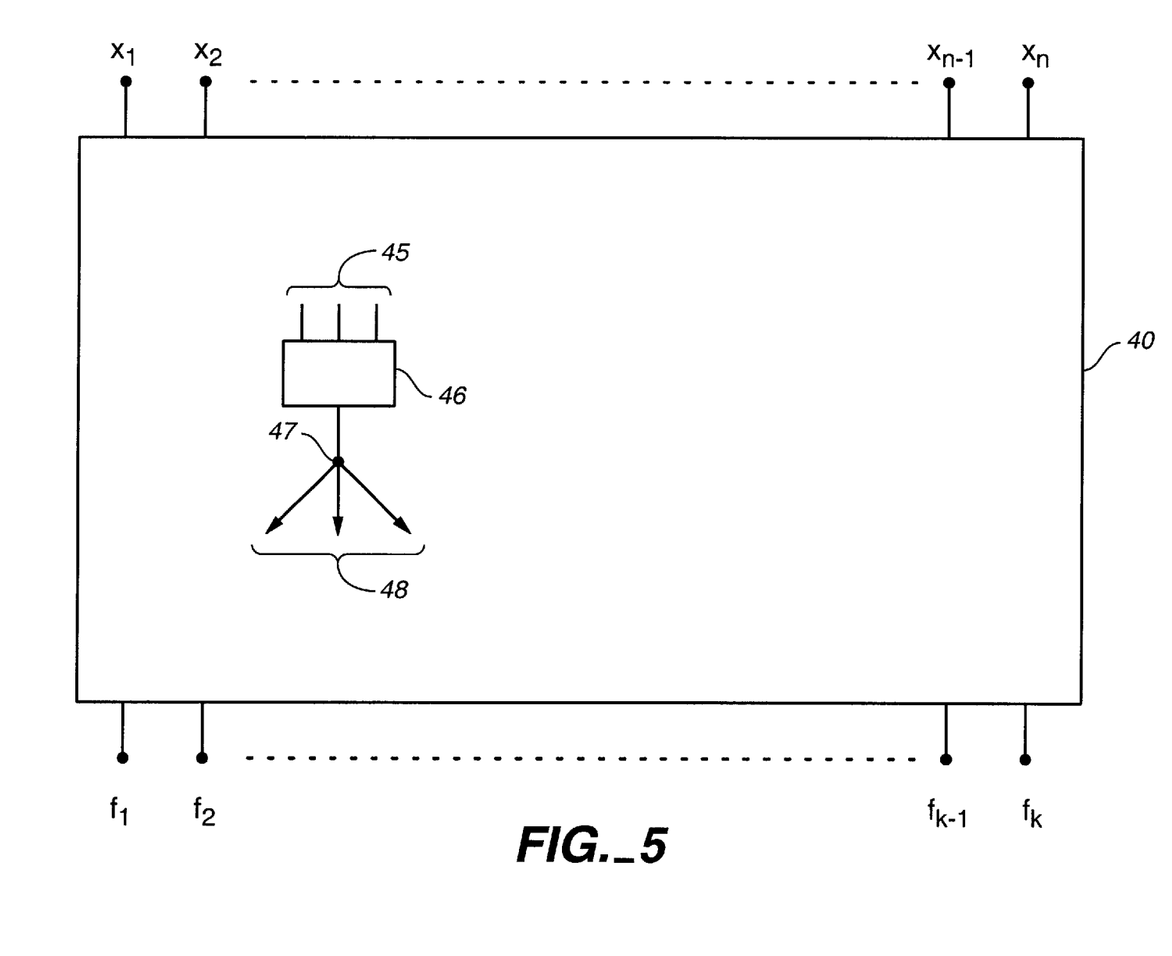
FIG. 5 provides an illustration of a cell within a combinational circuit S.

FIG. 5 provides an illustration of a cell 46, which is one possible example of cell c discussed above, within combinational circuit 40 (i.e., circuit S). The cell 46 has inputs 45 and an output to pin 47, which is an example of output pin p discussed above. Pin 47 provides inputs 48 to other cells within combinational circuit 40 (i.e., circuit S).

In accordance with FIG. 4, let S be a combinational circuit with input variables $x_1, \ldots, x_n$ such that $f_c[p] (x_1, \ldots, x_n)$ is a Boolean function that characterizes the output of pin p of the logical cell c in S. The output pin p is a constant pin if the function $f_c[p] (x_1, \ldots, x_n)$ is equal to constant (i.e., $f_c[p] (x_1, \ldots, x_n)=0$ or $f_c[p] (x_1, \ldots, x_n)=1$).

FIG. 5 provides an illustration of such a cell 46 within combinational circuit S 40. The cell has inputs 45 and an output to pin 47. Pin 47 provides inputs 48 to other cells within combinational circuit S 40.

Let F be a list of each of the functions that describe the output pins of all cells of the circuit S. The present invention involves detecting which of the functions in list F are constants.

Determining the existence of constant pins is important in connection with the design of combinational circuits, in particular in the context of the optimizing circuit design. Knowledge of constant pins in a circuit allows circuit designers to make propagating constants forwards and backwards with the purpose of simplification of the circuit and reducing the overall gate count. Such simplification can reduce the overall footprint of the circuit as well as reduce timing delays in the circuit.

Figure 6:
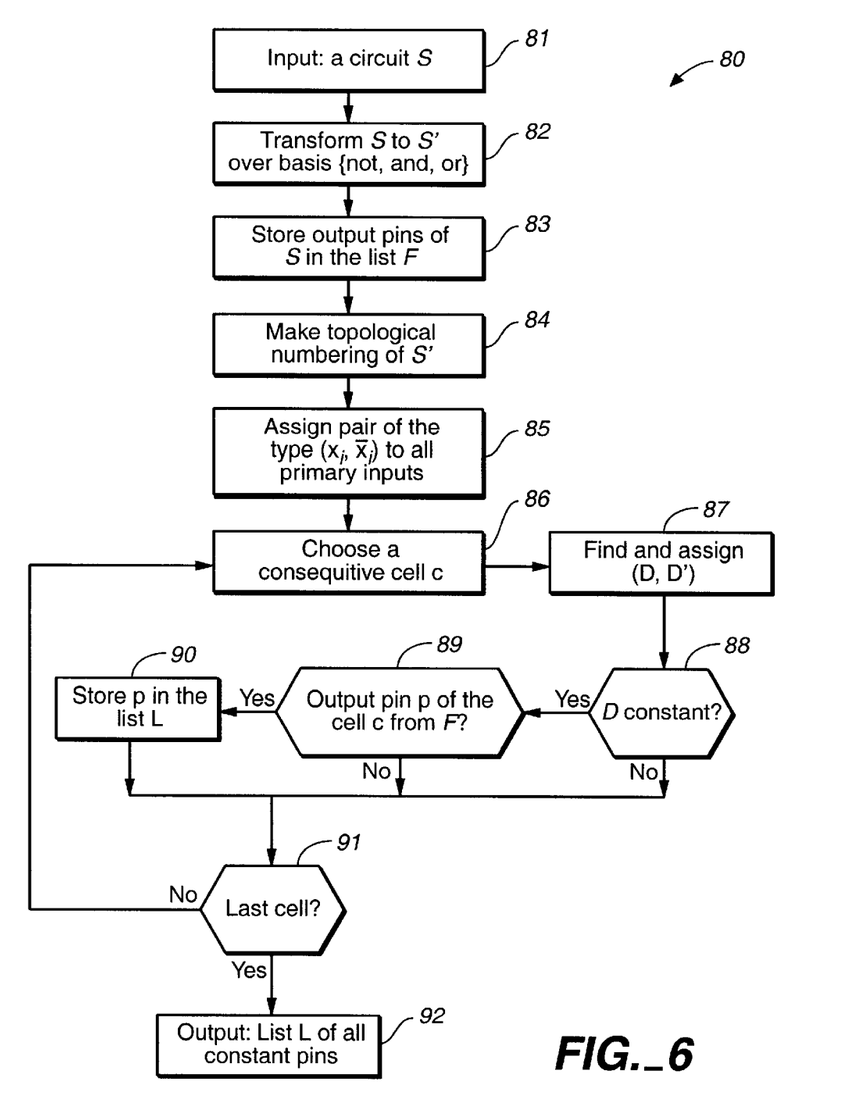
FIG. 6 provides a flow chart 80 that sets forth the basic steps of the preferred embodiment of the present invention.

FIG. 6 provides a flow chart 80 that illustrates the basic steps of the preferred embodiment of the present invention. First, a combinational circuit S is input into the apparatus 81. The combinational circuit S is then transformed into an equivalent circuit S' such that all cells are broken down into the basic gates NOT, AND, and OR 82. Next, the output pins of the original S are stored into the list F 83. Then, the system makes a topological ordering of the output pins of equivalent circuit S' 84.

Then, all primary inputs into equivalent circuit S' are assigned a corresponding pair of values $(x_i, \overline{x_i})$ 85. An output pin of a consecutive logic gate (which is either AND, OR or NOR) is then chosen 86. A pair of sum of products (SP) is assigned for the output pin based on its predecessor cells 87. The first sum of products is a function that describes the output pin and the second is the complement (negation) of the first. It is then determined whether the output pin has a constant value 88. If it is, and the output pin is included in list F 89, the output pin and its constant. value are stored on a second list L 90. Another consecutive cell is then chosen and the process is repeated for all cells in the equivalent circuit S' 91. After the process is repeated for all cells in the equivalent circuit S', the system outputs the list L of all constant pins in combinational circuit S 92. The inventive process is described more fully below.

1. Transformation of Circuit

Figure 7A:
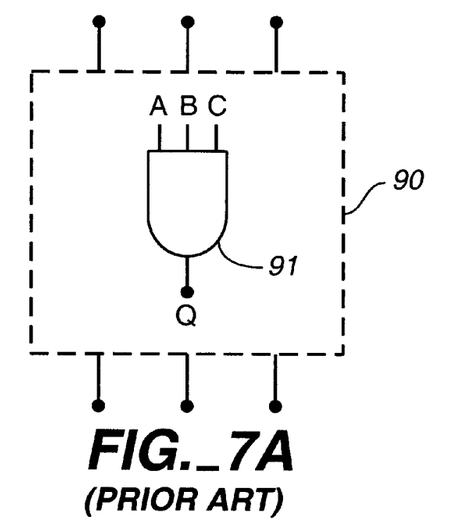
FIG. 7A depicts a cell comprising a three-input AND gate.
Figure 7B:
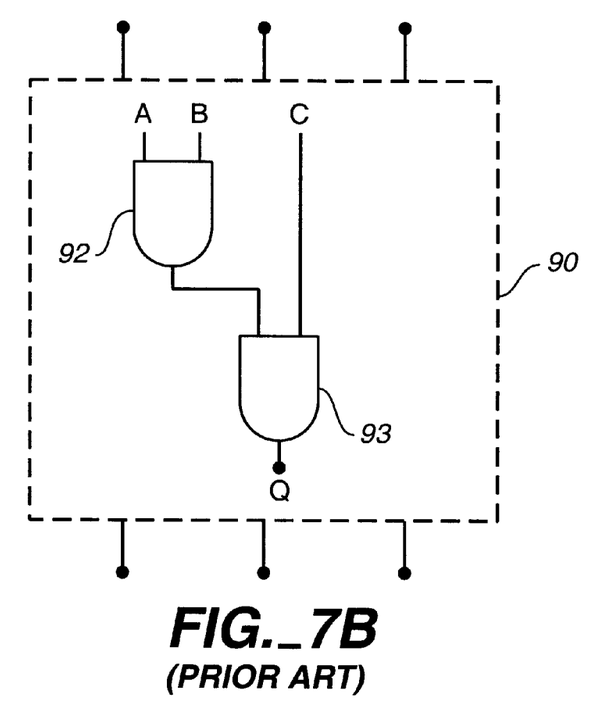
FIG. 7B depicts the result of transforming a three-input AND gate.

Therefore, as a first basic step, a given circuit S is transformed into an equivalent circuit comprised of basic gates. In the preferred embodiment, those basic gates are the AND, OR and NOT gates. Initially, a given combinational circuit S is input into the system 81. The circuit S is then transformed into an equivalent circuit S'. For example, in FIG. 7A, a cell 90 comprising a three-input AND gate 91 is depicted. In the transformation process such a gate is transformed into, as depicted in FIG. 7B, a two-input AND gate 92, with its output being input into a second two-input AND gate 93. The output of the cell remains the same. The output of the cell is noted in a list F. All of the original cell outputs are noted in said list F.

Additionally, other logic gates are also broken down into AND, OR, and NOT gates. For example, an AND-OR gate can be broken down as shown in FIG. 2. A XOR gate can be broken down as shown in FIGS. 3A and 3B. Similarly, a NAND gate can be broken down into an AND gate connected to a NOT gate. Likewise, a NOR gate can be broken down into an OR gate connected to a NOT gate. In the preferred embodiment equivalent circuit S' comprises only AND, OR and NOT gates.

2. Topological Numbering of Outputs

In the next basic step, the outputs of the various AND, OR and NOT gates are put into topological order. The zero level consists from all the primary inputs of the equivalent circuit S'. We assign consequently the remaining cells to levels j, where j=1, 2, ... j represents the length the maximal oriented path goes from inputs of the circuit (0 level) to the given cell.

Figure 8A:
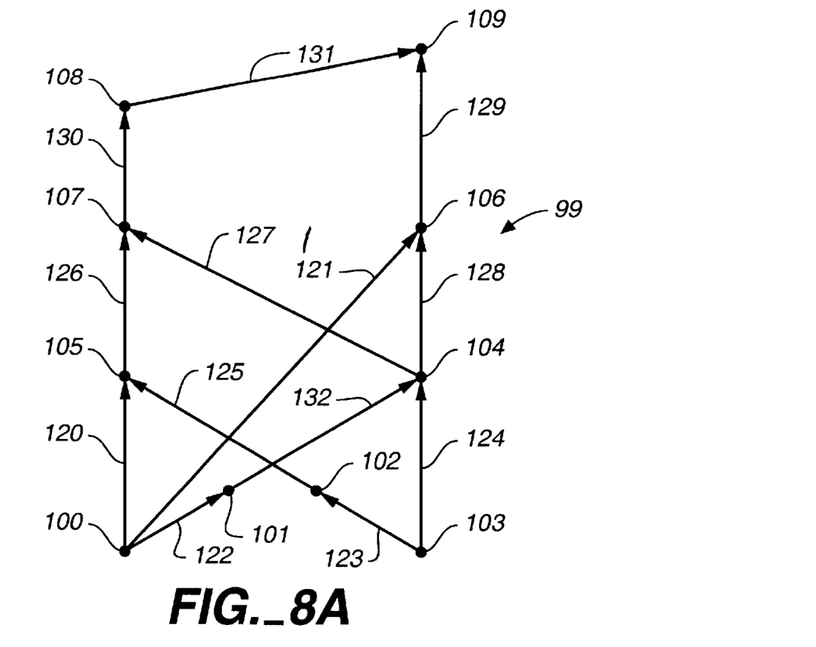
FIG. 8A illustrates a combinational circuit.

FIG. 8A shows the underlying graph representing a combinational circuit 99. The combinational circuit 99 has two primary input pins (100 and 103). Pin 100 provides an input 120 to pin 105, an input 121 to pin 106, and an input 122 to pin 101. Pin 103 provides an input 123 to pin 102 and an input 124 to pin 104.

As shown in FIG. 8A, pin 101 provides an input 132 to pin 104 and pin 102 provides an input 125 into pin 105. Pin 105 provides an input 126 into pin 107 and pin 104 provides an input 128 into pin 106 and provides an input 127 into pin 107. Pin 107 provides an input 130 into pin 108, which in turn provides an input 131 into pin 109. Finally, pin 106 provides an input 129 into pin 109.

According to the preferred embodiment of the present invention, pins 100 and 103, because they are primary inputs of the combinational circuit 99, are assigned to level 0. Inputs 120, 121, 122, 123, 124 are then identified as coming from pins in level 0. Each pin that receives one of these inputs is considered for inclusion in level 1. However, only pins 101 and 102 are assigned to level 1. Pin 105 is not included in level 1 because it also accepts input 125. Similarly, pin 104 is not included in level 1 because it also accepts input 132 and pin 106 is not included in level 1 because it also accepts input 128.

In the next step, the system identifies inputs 132 and 125 as coming from pins in level 1. Pin 104 and pin 105 are then included in level 2, because each only accepts inputs coming from level 1 or lower.

In the next step, the system identifies inputs 126, 127 and 128 as coming from pins in level 2. Pins 107 and 106 are then included in level 3 because they receive inputs only from pins in level 2 and lower.

In the next step, inputs 130 and 129 are identified as coming from pins in level 3. Accordingly, pin 108 is assigned to level 4. Pin 109 is not assigned to level 4 because it accepts input 131, which is not from a pin in level 3 or lower.

Figure 8B:
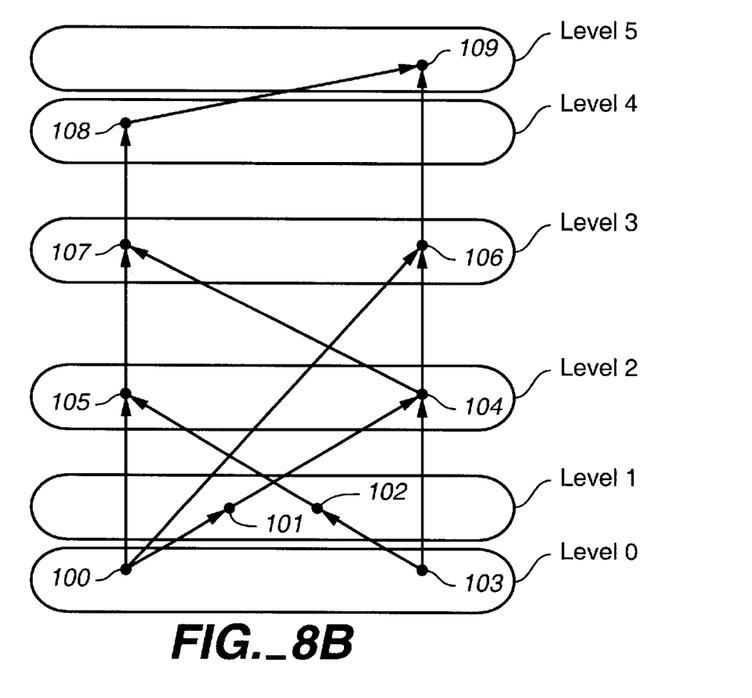
FIG. 8B shows the pins of a combinational circuit in their assigned levels.

In the next step, input 131 is identified as coming from a pin in level 4. According to the method, pin 109 is assigned to level 5. FIG. 8B shows the pins of circuit 99 in their assigned levels.

3. Assigning Cells an Order Pair of Sum-of-Products

In the preferred embodiment, an ordered pair of sum-of-products (SP) representations is utilized for each cell c of the equivalent circuit S'. The first sum-of-products characterizes the function $f_c[p]$ itself. The second sum-of-products is for the complement (negation) of $f_c[p]$. Moving along the circuit from its primary inputs towards primary outputs, a pair of SP is determined for each cell c in the equivalent circuit S'. The SP are computed from the SP that have already been computed for the predecessors of the current cell c (since the predecessor cells were in lower levels). The computation of new pairs of SP is dependent of the type of logical gate (i.e., NOT, AND or OR) that comprises the current cell. After the new pair of SP for the current cell c is computed, the system then determines whether the output of current cell c is a constant. The output of the current cell c is a constant if one of the SP of the new pair of SP is 0.

For purposes of this specification, the sum-of-products (SP) of a Boolean function f is denoted as D(f). SP D is a disjunction sum of elementary conjunction: $D=K_1+\ldots+K_s$. For purposes of this specification, constant 1 is also an elementary conjunction and the empty (i.e. without elementary conjunction) SP represents constant 0.

During the process of computing SP for cells, the SP are simplified utilizing basic reduction operations. Common Boolean operations of product (conjunction) and of sum (disjunction) are extended as well over elementary conjunctions (so we can multiply them) as over SP (we can both multiply and add them). In particular, as discussed above, when multiplying elementary conjunction the following equalities $$xK \cdot \bar{x}K'=0, 0 \cdot K=0, 1 \cdot K=K$$

hold true. In addition, the following with constants also hold true $$0+D=D, 1+D=1, 0 \cdot D=0, 1 \cdot D=D.$$

As always, the distributive rule applies to multiplication of two nonempty SP.

Besides that, when performing transformation and simplification over SP we omit those of elementary conjunctions that are absorbed (relatively the natural partial order over the set of all elementary conjunctions) by other elementary conjunction from the same SP.

It is important to stress that all of the above-mentioned operations over SP can be accomplished with algorithms of quadratic complexity on a number of elementary conjunction in SP (i.e. the complexity of algorithms is $O(s^2)$, where s signifies a maximal number of elementary conjunction of SP involved). On implementing the operations, programming heuristics to speed up computation of Boolean operations over SP can be used.

If during the process of computation one of the SP in the pair $(D(f), D(\bar{f}))$ vanishes (this can happen on multiplying two SP), the corresponding function is equal to a constant. In such a case, the other function is definitely a constant as well and we can substitute a corresponding SP in the pair with constant 1. Thus we get pair (0,1) or (1,0) in this case and assign it to the corresponding cell. In addition we store the constant pin detected if it is from the original circuit S into a list L.

In computing the pair of SP for a current cell c, there are three possibilities—cell c consists of a NOT, AND, or OR gate. If the current cell c is a NOT gate, and its direct predecessor cell c' was already associated with a pair of SP (D, D'), then the pair of SP for cell c' is interchanged such that the pair of SP associated with cell c is (D', D).

Suppose the current cell c is an AND gate and cells $c_1$ and $c_2$ (each of which is a direct predecessor of cell c). Further suppose that cells $c_1$ and $c_2$ have each been previously associated with a pair of SP $(D_1, D_1')$ and $(D_2, D_2')$, respectfully. Then the pair of SP for the current cell c is $D=D_1 \cdot D_2$ and $D'=D_1'+D_2'$. If D is not equal to 0, the obtained pair of SP (D, D') is associated with the current cell c. In the case where SP D is equal to 0, we associate with the cell c the pair (0,1).

Now suppose the current cell c is an OR gate and cells $c_1$ and $c_2$ (each of which is a direct predecessor of cell c). Further suppose that cells $c_1$ and $c_2$ have each been previously associated with a pair of SP $(D_1, D_1')$ and $(D_2, D_2')$, respectfully. Then the pair of SP for the current cell c is $D=D_1+D_2$ and $D'=D_1' \cdot D_2'$. If D' is not equal to 0, the obtained pair of SP D, D') is associated with the current cell c. In the case where SP D' is equal to 0, we associate with the cell c the pair (1,0).

Figure 9:
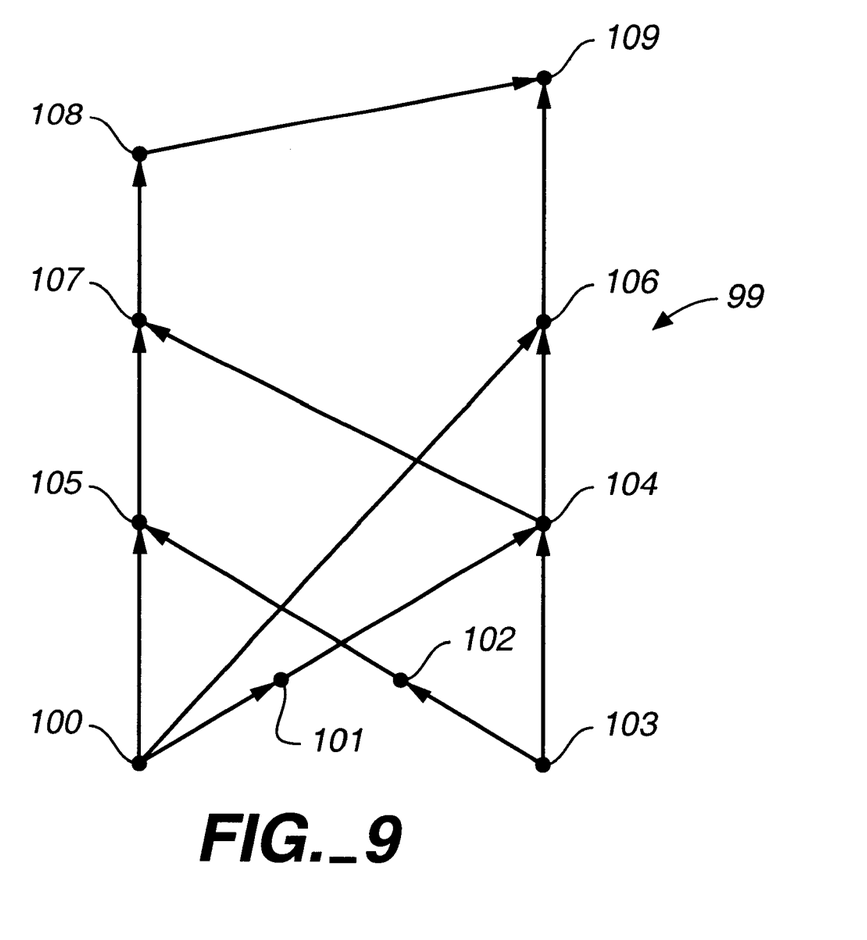
FIG. 9 illustrates the process of computing pairs of SP for each of the output pins in the equivalent circuit S'.

FIG. 9 illustrates the process of computing pairs of SP for each of the output pins in the equivalent circuit S'. In FIG. 9, combinational circuit 99 is presented. Suppose the gates 100 to 109 each perform the functions as shown in Table 9A below.

TABLE 9A

| Gate (output pin) | Function |
| --- | --- |
| 100 | Primary input x |
| 101 | NOT |
| 102 | NOT |
| 103 | Primary input y |
| 104 | AND |
| 105 | AND |
| 106 | OR |
| 107 | OR |
| 108 | NOT |
| 109 | OR |

Primary input pin 100 is assigned the pair $(x,\bar{x})$ and primary input pin 103 is assigned the pair $(y,\bar{y})$. Starting at level 1, we compute the pairs of SP for pins 101 and 102. For pin 101, we compute the pair of SP as $(\bar{x},x)$, since the gate at 101 is a NOT gate. We continue this process up the levels until we reach the final level, level 5 (which includes pin 109). Table 9B shows the results of our computation.

TABLE 9A

| Gate (output pin) | Computed Pairs of SP |
| --- | --- |
| 100 | $(x, \bar{x})$ |
| 101 | $(\bar{x}, x)$ |
| 102 | $(\bar{y}, y)$ |
| 103 | $(y, \bar{y})$ |
| 104 | $(x\bar{y}, \bar{x} + y)$ |
| 105 | $(\bar{x}\bar{y}, x + y)$ |
| 106 | $(x + \bar{x}y, \bar{x}\bar{y})$ |
| 107 | $(x\bar{y} + xy, \bar{x}\bar{y} + \bar{x}y)$ |
| 108 | $(\bar{x}\bar{y} + xy, \bar{x}y + \bar{x}y)$ |
| 109 | $(x + \bar{x}y + \bar{x}y, 0) = (1, 0)$ |

For example, for the first component of the SP pair for output pin 109, we compute as follows:

$$\bar{x}\bar{y}+xy+x+\bar{x}y=x+\bar{x}\bar{y}+\bar{x}y$$

This result is derived using the first components from cells 108 and 106. Note that the end result takes into account absorption due to the fact that x+xy=x.

For the second component, we obtain $(x\bar{y}+\bar{x}y)\overline{xy}=0$. Hence, the first component can be changed to 1 and cell 109, therefore, represents a constant. In other words, because one of the pair of SP for cell 109 is zero (empty), the output of cell 109 is a constant.

The power of the ability to so determine that cell 109 is a constant can be seen, for example, if the output of cell 109 is the primary output for combinational circuit 99. If so, all of the entirety of circuit 99 can be eliminated and the output 109 merely set to 1. This eliminates the need for eight gates and the primary inputs.

D. Apparatus for Performing Present Invention

Figure 10:
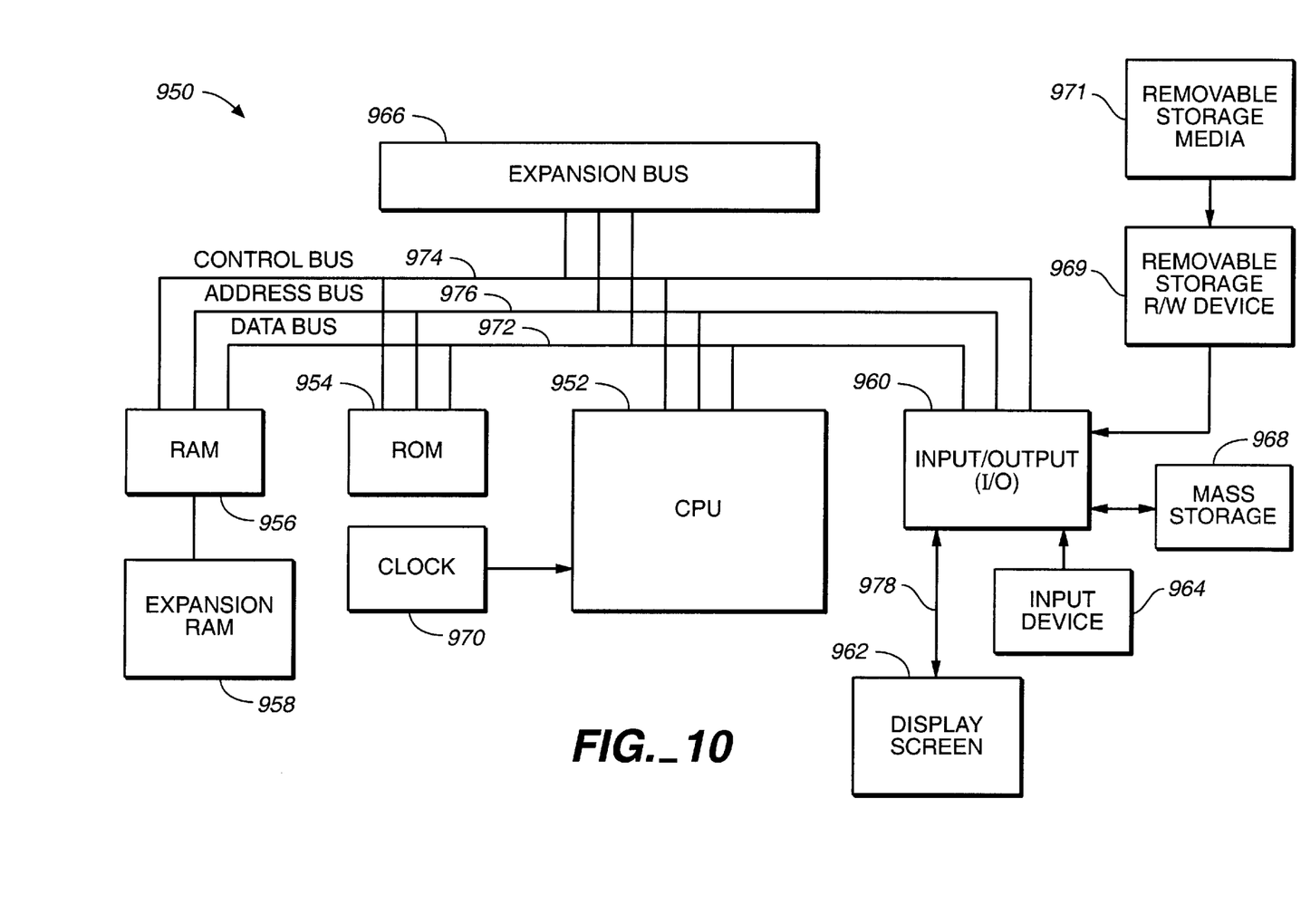
FIG. 10 is an illustration of a general purpose computer system.

FIG. 10 is an illustration of a general purpose computer system, representing one of many suitable computer platforms for implementing the inventive IC design optimization methods described above. FIG. 10 shows a general purpose computer system 950 in accordance with the present invention includes a central processing unit (CPU) 952, read only memory (ROM) 954, random access memory (RAM) 956, expansion RAM 958, input/output (I/O) circuitry 960, display assembly 962, input device 964, and expansion bus 966. Computer system 950 may also optionally include a mass storage unit 968 such as a disk drive unit or nonvolatile memory such as flash memory and a real-time clock 970.

CPU 952 is coupled to ROM 954 by a data bus 972, control bus 974, and address bus 976. ROM 954 contains the basic operating system for the computer system 950. CPU 952 is also connected to RAM 956 by busses 972, 974, and 976. Expansion RAM 958 is optionally coupled to RAM 956 for use by CPU 952. CPU 952 is also coupled to the I/O circuitry 960 by data bus 972, control bus 974, and address bus 976 to permit data transfers with peripheral devices.

I/O circuitry 960 typically includes a number of latches, registers and direct memory access (DMA) controllers. The purpose of I/O circuitry 960 is to provide an interface between CPU 952 and such peripheral devices as display assembly 962, input device 964, and mass storage 968.

Display assembly 962 of computer system 950 is an output device coupled to I/O circuitry 960 by a data bus 978. Display assembly 962 receives data from I/O circuitry 960 via bus 978 and displays that data on a suitable screen.

The screen for display assembly 962 can be a device that uses a cathode-ray tube (CRT), liquid crystal display (LCD), or the like, of the types commercially available from a variety of manufacturers. Input device 964 can be a keyboard, a mouse, a stylus working in cooperation with a position-sensing display, or the like. The aforementioned input devices are available from a variety of vendors and are well known in the art.

Some type of mass storage 968 is generally considered desirable. However, mass storage 968 can be eliminated by providing a sufficient mount of RAM 956 and expansion RAM 958 to store user application programs and data. In that case, RAMs 956 and 958 can optionally be provided with a backup battery to prevent the loss of data even when computer system 950 is turned off. However, it is generally desirable to have some type of long term mass storage 968 such as a commercially available hard disk drive, nonvolatile memory such as flash memory, battery backed RAM, PC-data cards, or the like.

A removable storage read/write device 969 may be coupled to I/O circuitry 960 to read from and to write to a removable storage media 971. Removable storage media 971 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 950 by typing on a keyboard, manipulating a mouse or trackball, or "writing" on a tablet or on position-sensing screen of display assembly 962. CPU 952 then processes the data under control of an operating system and an application program stored in ROM 954 and/or RAM 956. CPU 952 then typically produces data which is outputted to the display assembly 962 to produce appropriate images on its screen.

Expansion bus 966 is coupled to data bus 972, control bus 974, and address bus 976. Expansion bus 966 provides extra ports to couple devices such as network interface circuits, modems, display switches, microphones, speakers, etc. to CPU 952. Network communication is accomplished through the network interface circuit and an appropriate network.

Suitable computers for use in implementing the present invention may be obtained from various vendors. Various computers, however, may be used depending upon the size and complexity of the optimization tasks. Suitable computers include mainframe computers, multiprocessor computers, workstations, or personal computers.

It should be understood that the present invention also relates to machine readable media on which are stored program instructions for performing methods of this invention. Such media includes, by way of example, magnetic disks, magnetic tape, optically readable media such as CD ROMs, DVD, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

E. Fabrication of Optimized ICs

After the initial circuit description is optimized as discussed above, additional steps must be taken to complete the manufacture of the IC. These additional steps are very well known by those skilled in the art of semiconductor fabrication and are briefly described below.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

Figure 11:
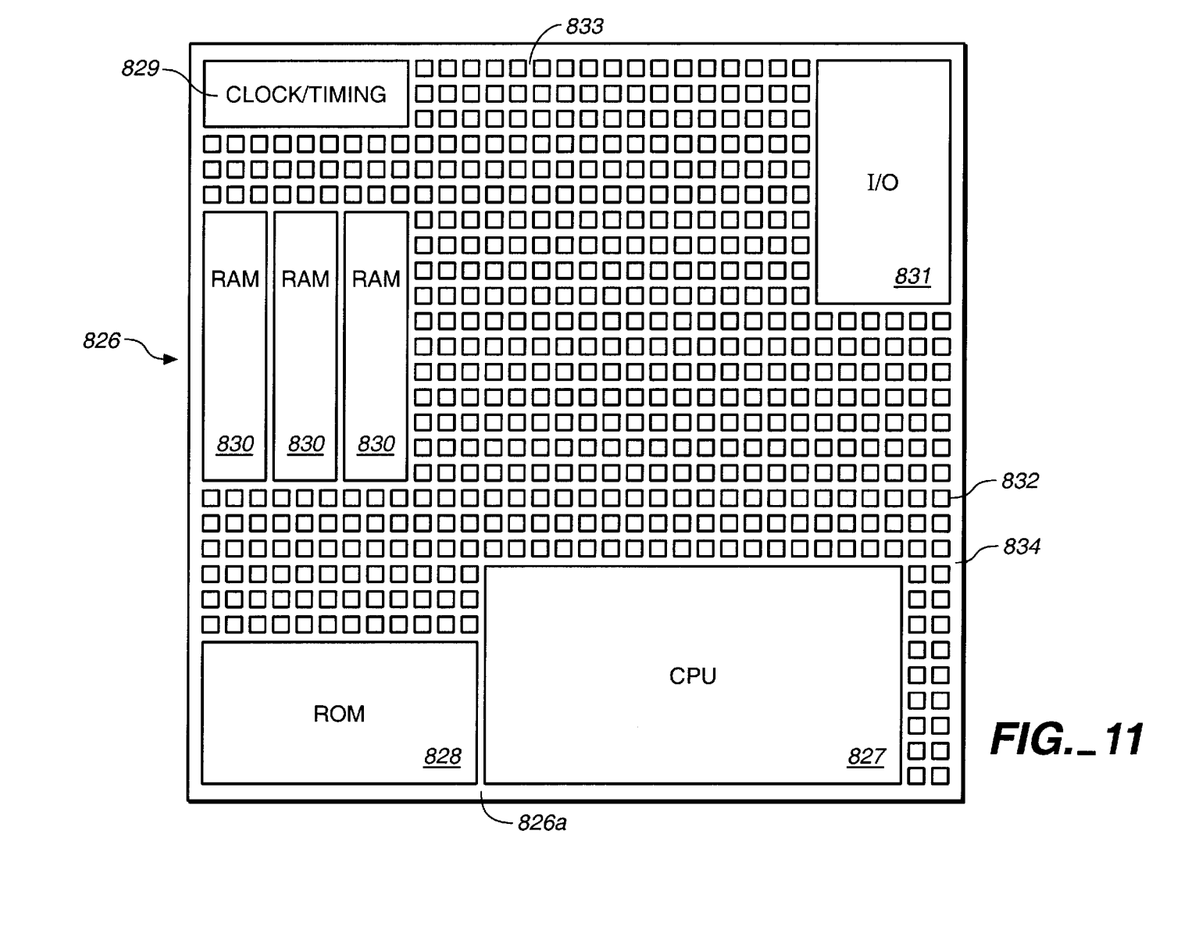
FIG. 11 depicts an exemplary integrated circuit chip.

An exemplary integrated circuit chip is illustrated in FIG. 11 and generally designated by the reference numeral 826. The circuit 826 includes a semiconductor substrate 826A on which are formed a number of functional circuit blocks that can have different sizes and shapes. Some are relatively large, such as a central processing unit (CPU) 827, a read-only memory (ROM) 828, a clock/timing unit 829, one or more random access memories (RAM) 830 and an input/output (I/O) interface unit 831. These blocks, commonly known as macroblocks, can be considered as modules for use in various circuit designs, and are represented as standard designs in circuit libraries.

The integrated circuit 826 further comprises a large number, which can be tens of thousands, hundreds of thousands or even millions or more of small cells 832. Each cell 832 represents a single logic element, such as a gate, or several logic elements interconnected in a standardized manner to perform a specific function. Cells that consist of two or more interconnected gates or logic elements are also available as standard modules in circuit libraries.

The cells 832 and the other elements of the circuit 826 described above are interconnected or routed in accordance with the logical design of the circuit to provide the desired functionality. Although not visible in the drawing, the various elements of the circuit 826 are interconnected by electrically conductive lines or traces that are routed, for example, through vertical channels 833 and horizontal channels 834 that run between the cells 832.

The input to the physical design problem is a circuit diagram, and the output is the layout of the circuit. This is accomplished in several stages including partitioning, floor planning, placement, routing and compaction.

Partitioning. A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement. This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

Routing. The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Compaction. Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

Wafer Construction. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for determining constant pins in a combinational circuit, said method comprising the following steps:
   a. associating an input of a combinational circuit with a first variable and a second variable, wherein said second variable is the complement of said first variable;
   b. computing for a first logical cell interconnected to said input a first mathematical representation, wherein said first mathematical representation is a function of the operation of said first logical cell and a function of said first variable;
   c. computing for said first logical cell a second mathematical representation, wherein said second mathematical representation is a function of the operation of said first logical cell and a function of said second variable; and
   d. determining whether one of said first and second mathematical representations is equal to a constant.

2. The method of claim 1 further comprising the following steps:
   e. computing for a second logical cell interconnected to said first logical cell a third mathematical representation, wherein said third mathematical representation is a function of the operation of said second logical cell and a function of said first mathematical representation;
   f. computing for said second logical cell a fourth mathematical representation, wherein said fourth mathematical representation is a function of the operation of said second logical cell and a function of said second mathematical representation; and
   g. determining whether one of said third and fourth mathematical representations is equal to a constant.

3. The method of claim 1 wherein said step of determining whether said one of said first and second mathematical representations is a constant comprises determining whether said one of said first and second mathematical representations reduces to 0.

4. The method of claim 1 wherein said first and second mathematical representations are each a sum-of-products.

5. The method of claim 2 wherein said third and fourth mathematical representations are each a sum-of-products.

6. A method for determining constant pins in a combinational circuit, said method comprising the following steps:
   a. inputting the design of a combinational circuit;
   b. transforming the design of said combinational circuit into a design of an equivalent combinational circuit by breaking down complex gates into more basic gates;
   c. associating an input of said equivalent combinational circuit with a first variable and a second variable, wherein said second variable is the complement of said first variable;
   d. computing for a first logical cell interconnected to said input a first mathematical representation, wherein said first mathematical representation is a function of the operation of said first logical cell and a function of said first variable;
   e. computing for said first logical cell a second mathematical representation, wherein said second mathematical representation is a function of the operation of said first logical cell and a function of said second variable; and
   f. determining whether one of said first and second mathematical representations is equal to a constant.

7. The method of claim 6 further comprising the following steps:
   g. computing for a second logical cell interconnected to said first logical cell a third mathematical representation, wherein said third mathematical representation is a function of the operation of said second logical cell and a function of said first mathematical representation;
   h. computing for said second logical cell a fourth mathematical representation, wherein said fourth mathematical representation is a function of the operation of said second logical cell and a function of said second mathematical representation; and
   i. determining whether one of said third and fourth mathematical representations is equal to a constant.

8. The method of claim 7 wherein said step of determining whether said one of said third and fourth mathematical representations is a constant comprises determining whether said one of said third and fourth mathematical representations reduces to 0.

9. The method of claim 8 wherein said first and second mathematical representations are each a sum-of-products.

10. The method of claim 7 wherein said third and fourth mathematical representations are each a sum-of-products.

11. The method of claim 6 further comprising the following steps:
   g. creating a list of cell output pins of the design of the combinational circuit input in step a; and
   h. determining whether an output pin of the first logical cell is in said list.

12. The method of claim 11 wherein step h occurs after step f.

13. The method of claim 6 wherein step b comprises transforming the design of said combinational circuit into a design of an equivalent combinational circuit that consists only of AND, OR and NOT gates.

14. The method of claim 7 comprising an assignment step of assigning logical gates in the equivalent combinational circuit to a topological order in which said logical gates appear in the equivalent combinational circuit.

15. The method of claim 14 further comprising a step of repeating steps d–f for the logical gates in the equivalent combinational circuit in the topological order assigned in the assignment step.

16. A computer-readable medium storing computer-executable. process steps for determining constant pins in a combinational circuit, wherein said process steps include steps to:

a. associate an input of a combinational circuit with a first variable and a second variable, wherein said second variable is the complement of said first variable;

b. compute for a first logical cell interconnected to said input a first mathematical representation, wherein said first mathematical representation is a function of the operation of said first logical cell and a function of said first variable;

c. compute for said first logical cell a second mathematical representation, wherein said second mathematical representation is a function of the operation of said first logical cell and a function of said second variable; and d. determine whether one of said first and second mathematical representations is equal to a constant.

17. The computer-readable medium of claim 16, wherein said method steps further comprise the steps to:

e. compute for a second logical cell interconnected to said first logical cell a third mathematical representation, wherein said third mathematical representation is a function of the operation of said second logical cell and a function of said first mathematical representation;

f. compute for said second logical cell a fourth mathematical representation, wherein said fourth mathematical representation is a function of the operation of said second logical cell and a function of said second mathematical representation; and g. determine whether one of said third and fourth mathematical representations is equal to a constant.

18. The computer-readable medium of claim 16 wherein said step of determining whether said one of said first and second mathematical representations is a constant comprises determining whether said one of said first and second mathematical representations reduces to 0.

19. The computer-readable medium of claim 16, wherein said first and second mathematical representations are each a sum-of-products.

20. The computer-readable medium of claim 17, wherein said third and fourth mathematical representations are each a sum-of-products.

* * * * *